(12) United States Patent
Meulenkamp et al.

(10) Patent No.: US 6,841,189 B2
(45) Date of Patent: Jan. 11, 2005

(54) BACK-END METALLISATION PROCESS

(75) Inventors: Eric Alexander Meulenkamp, Eindhoven (NL); Maria Jeanne Schroevers, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 322 days.

(21) Appl. No.: 10/113,040

(22) Filed: Apr. 1, 2002

(65) Prior Publication Data

US 2002/0144908 A1 Oct. 10, 2002

(30) Foreign Application Priority Data

Apr. 4, 2001 (EP) .............................................. 01201228

(51) Int. Cl.⁷ .............................. B05D 5/12; B05D 3/00; C25D 5/02; H01L 21/288
(52) U.S. Cl. ........................... 427/58; 427/97; 427/299; 427/301; 205/115; 205/118; 205/123; 205/125; 205/210
(58) Field of Search .................................. 205/118, 123, 205/125, 115, 210; 427/97, 210, 299, 301, 58

(56) References Cited

U.S. PATENT DOCUMENTS

| 4,751,106 | A | | 6/1988 | Wilkinson et al. ............ 427/98 |
|---|---|---|---|---|
| 4,948,707 | A | * | 8/1990 | Johnson et al. ............. 430/311 |
| 5,576,052 | A | | 11/1996 | Arledge et al. ................ 427/98 |
| 5,866,237 | A | | 2/1999 | Angelopoulos et al. ...... 428/209 |
| 6,077,780 | A | | 6/2000 | Dubin ........................ 438/687 |
| 6,565,729 | B2 | * | 5/2003 | Chen et al. ................... 205/82 |
| 6,660,154 | B2 | * | 12/2003 | Merricks et al. ............ 205/183 |

FOREIGN PATENT DOCUMENTS

WO WO9947731 9/1999 ............. C25D/3/58

* cited by examiner

*Primary Examiner*—Edna Wong
(74) *Attorney, Agent, or Firm*—Peter Zawilski

(57) ABSTRACT

The invention provides for a back-end metallisation process in which a recess is filled with copper and which includes the step of forming a plating base on the surfaces of the recess for the subsequent galvanic deposition of the said copper, and wherein subsequent to the formation of the plating base, but prior to the galvanic deposition of the copper, a modifying agent is introduced to the recess and which serves to absorb in the surface regions not covered by the plating base and to thereby modify the surface to promote copper growth thereon so as to effectively repair the initial plating base before the copper plating fill commences.

11 Claims, 2 Drawing Sheets

BACK-END METALLISATION PROCESS

The present invention relates to a method of manufacturing an electronic device and, in particular, to a back-end metallisation process in which a recess is to be filled with copper and including the step of forming a plating base on the surfaces of the recess for subsequent galvanic deposition of the said copper.

As part of the known damascene process for achieving back-end metallisation, recesses, for example vias and holes, are filled with copper by means of a galvanic deposition process. This process requires the presence of a plating base, such as a so-called copper seed layer, which is formed on the surfaces of a recess and which serves to provide sufficient conductance to allow for a uniform current distribution across, for example, a wafer substrate within which recesses are filled during subsequent galvanic copper deposition.

However, the quality and integrity of such a plating base layer when applied to wafers with recesses exhibiting high aspect ratio values, for example larger than four for recess diameters smaller than 18 $\mu$m, can prove to be disadvantageously limited. The layer often proves to be insufficient insofar as it is too thin or is non-uniform. Such variations in thickness and uniformity prevent complete copper-fill of the recess during the subsequent galvanic deposition, such that copper-free voids remain within the structure.

WO-A-99/47731 relates to a damascene process in which an initial copper seed layer forming a plating base is subsequently enhanced by an electrode deposition reaction employing a dedicated alkaline solution. Once a predetermined copper thickness has been obtained further plating steps are undertaken in order to fill any gaps that arise. However, this known process is disadvantageous in that it cannot be performed in relation to an initial copper-seed layer of ordinary thickness since with relatively large wafers, non-uniformity problems would arise during the subsequent enhancement step due to the high sheet resistance values encountered. Further, this known process requires electrical contact in order to achieve the required surface modification and the use of an alkaline plating solution can lead to large pH variations which can, in turn, impose disadvantageously strict requirements with regard to rinsing requirements between the various process steps.

SUMMARY OF INVENTION

The present invention seeks to provide for a back-end metallisation process exhibiting an advantage of known such processes.

According to one aspect of the present invention there is provided a back-end metallisation process of the above-mentioned type and characterized in that, subsequent to the formation of the plating base, but prior to the galvanic deposition of the said copper, a modifying agent is introduced to the recess which is arranged to absorb in surface regions of the recess not covered by the plating base and thereby modify the said surface regions so as to promote galvanic deposition of copper thereon.

The invention is advantageous in that the process can be applied to a copper seed layer of standard, or even lower, thickness and, further, the surface modification does not require electrical contact and can be achieved by means of an acidic or neutral solution. The process is also advantageously self-limiting in that, after a certain time period, the surface modification can achieve uniformity across, for example, the whole wafer in which recesses are formed.

The invention therefore provides for a relatively simple process which does not result in large pH variations and wherein currently available well-developed solutions can be used. For example, an acidic copper plating bath can be employed of the same or similar type to that which is standard in a current damascene back-filled process.

It will therefore be appreciated that, for example, the side-wall surfaces of recesses such as vias and holes, formed in a semiconductor wafer, can be modified after the copper seed layer has been deposited. Such modification serves to enhance subsequent galvanic copper growth in a lateral direction until all regions of the side-wall surface of the via or hole are covered with copper such that normal galvanic copper growth can then occur without the above-mentioned problematic voids remaining. The process step applied to the wall regions not covered by the copper seed layer can of course also be applied to regions where the copper seed layer is present.

Various embodiments of the present invention advantageously provide for enhancing the high lateral growth rate of copper, and improving the lateral growth of copper on regions of the side-wall surfaces where the copper seed layer is absent.

The features of the remaining claims relate to advantageous forms of the modifying agent having regard to the standard composition of a substrate layer to which a copper-fill damascene process is applied.

As will therefore be appreciated, the present invention provides, for example, for the modification of the surface of recess side-walls so as to promote lateral growth of galvanic copper. Such lateral growth is defined as a higher growth rate in a direction parallel to the wafer surface than in a direction perpendicular thereto such that, for example, an insufficient copper seed layer is then first repaired by the said lateral growth prior to steps relating to normal recess fill.

The electronic device is a semiconductor device by preference, and especially an integrated circuit. In this embodiment the recess is present at a side of a semiconductor substrate, in which a plurality of semiconductor elements, such as transistors and diodes, have been defined. As will be known by the person skilled in the art, integrated circuits usually comprise 3–6 interconnect layers. Vias are present between these interconnect layers, and between and interconnect layer and contacts of the individual transistors. Alternatively, the electronic device may be a thin-film device comprising a plurality of passive components, and optionally, any thin film transistors

BRIEF DESCRIPTION OF DRAWINGS

The invention is described further hereinafter, by way of example only, with reference to the accompanying drawings in which.

DETAILED DESCRIPTION

Figure 1A:
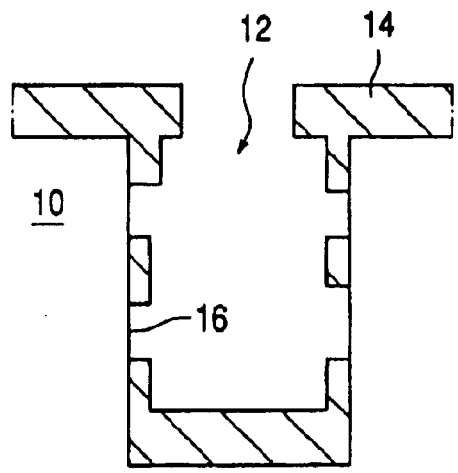
FIGS. 1A and 1B illustrate steps involved in a galvanic deposition process in accordance with the prior art and with regard to a wafer having high aspect ratio vias.

Turning first to FIG. 1A, there is illustrated a schematic cross-section of a semiconductor wafer 10 having a recess such as a hole 12 formed therein and which it is intended be filled with copper in accordance with a back-end copper-fill damascene process with galvanically deposited copper. The dimensions of the hole illustrated are such as to exhibit a relatively high aspect ratio, for example larger than four for recess diameter smaller than 0.18 μm as will become quite common with future generation damascene products since even dimensions of 0.13 and 0.10 μm and smaller are likely to be used in the near future, and even smaller sizes are likely to be pursued in the longer term.

Figure 1B:
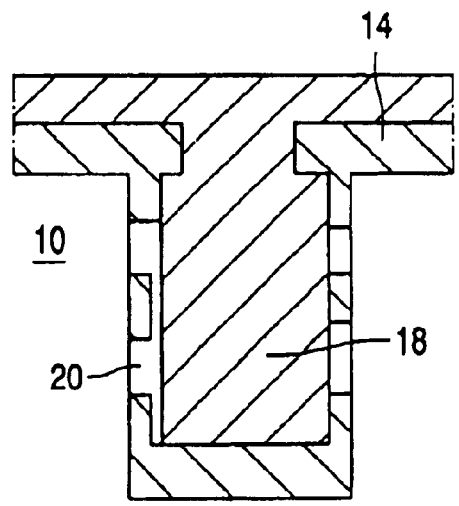

Prior to deposition of the galvanic copper, a copper seed layer 14 is deposited by sputtering on the exposed surfaces of the wafer 10 including the surfaces of the recess 12. However, for such aspect ratio values, such a process can disadvantageously result in poor coverage of the recesses walls. This is illustrated in FIG. 1A by reference to portion 16 of the side-wall surfaces of the recess 12 which remain uncovered by the copper seed layer 14. If, as illustrated in FIG. 1B, galvanic deposition of copper proceeds so as to achieve copper fill of the recess 12 by means of plated copper 18, it should be appreciated that voids 20 remain within the structure which can prove particularly disadvantageous and should be avoided.

It is a requirement of the present invention to prevent the formation of such voids in a relatively simple and readily adaptable manner.

Figure 2A:
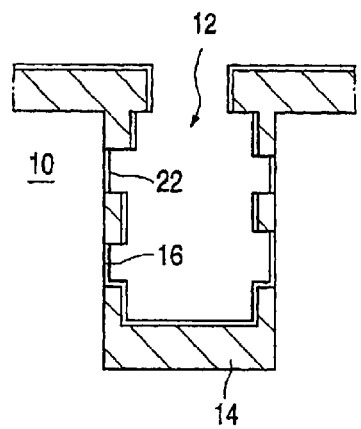
FIGS. 2A, 2B and 2C illustrate three stages in a back-end metallisation process involving copper-fill in accordance with an embodiment of the present invention.
Figure 2B:
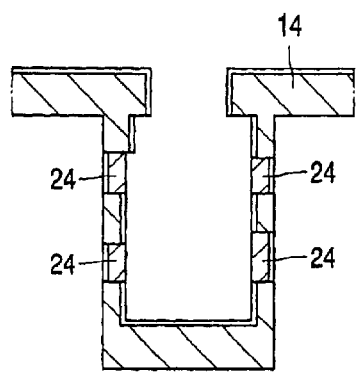
Figure 2C:
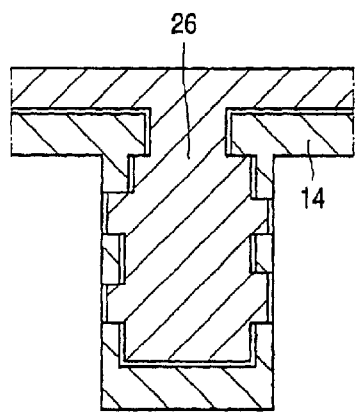

Turning now to FIGS. 2A–2C, there is illustrated a basic wafer structure corresponding to that illustrated with reference to FIGS. 1A and 1B. However, importantly, the process steps differ in that, as illustrated in FIG. 2A, a modifying agent is applied to the wafer so as to modify at least the exposed surfaces of the side-wall surfaces of the recess 12. As illustrated in FIG. 2A, but which is not essential to the present invention, the modifying agent can also be applied to the surfaces of the copper seed layer. However, it should be appreciated that it is the modification of the exposed surface regions appearing subsequent to the application of, for example, a poor quality seed layer that represents an important aspect of the present invention.

In the illustrated example, it is in fact a Ta, or TaN (Tantalum Nitride) etc., barrier layer formed on the side wall surfaces of the recess 12 prior to introduction of the copper seed layer that is in fact modified in accordance with this illustrated embodiment of the present invention.

As will be appreciated, this modification serves to enhance lateral growth of a galvanic copper layer on the above-mentioned modified barrier layer.

Such surface modification requires that the modifying agent absorb on the exposed surface, for example the barrier layer exposed surface 16 such as that mentioned above. Further, such modification advantageously serves to improve the electrochemical kinetics for copper deposition so as to increase the speed of electron transfer reaction whilst limiting the nucleation overpotential for copper. That is, the current density at the modified barrier surface is higher than at the copper seed layer surface and so, under constant current electroplating as commonly arises in a damascene process, the current is then advantageously concentrated towards the modified barrier surface and the above-mentioned required lateral growth is achieved.

In an alternative process, the surface modification agents function on the basis of a mixture of the organic additives commonly found within a galvanic plating bath since such additives serve to decrease the copper plating rate at a given potential by the absorption on the copper seed layer. The surface modification agents absorbed into the exposed surface 22 can prove to be more strongly bonded to the barrier material then the aforementioned plating bath additives such that the decrease in the plating rate only occurs on the copper seed layer and so thereby results in relative lateral growth on the required exposed recess surfaces. The modified exposed surface 22 of the recess therefore provides for initial copper growth 24 a non-copper surface regions 22 during the early stages of the galvanic copper plating such that, upon completion of the galvanic copper plating 26 as illustrated in FIG. 2C, the formation of voids is at least advantageously limited or prevented.

Advantageously, the modifying agent can consist of metallic nanoparticles such as palladium or a Pd/Sn alloy, or can comprise saline exhibiting suitable functionality, such as those of a cyanide-, amine- or thiol-group. Thus, in accordance with this aspect of the present invention a silane with one functional group such as cyanide, amine, thiol, etc and three alkoxy groups can be used which serve to ensure proper bonding of the silane to the substrate. It should of course be appreciated that such a class of molecules is not limited to silanes, titanates and others can be used.

It should therefore be appreciated that the present invention provides for a relatively simple and adaptable process for effectively repairing initial copper seed layers that, particularly for reasons of aspects ratio, exhibit variations in thickness sufficient to provide for exposed side-surface walls of a recess.

It should however be appreciated that the present invention is not restricted to the details of the foregoing example. For example, the process can be incorporated in the copper-fill of any appropriate structure whether encompassing vias or holes etc. and, further, a choice of surface-modification agents is not restricted to those discussed above but can comprise any appropriate agent serving to be absorbed into the exposed side-wall surface of the recess so as to enhance the initial growth of copper thereon.

What is claimed is:

1. A method of manufacturing an electronic device that includes a recess to be filled with copper, the recess having surfaces, the method comprising:

forming a plating base on at least a first portion of the surfaces of the recess for subsequent galvanic deposition of the copper, there being at least one surface region not covered by the plating base; and introducing, subsequent to the formation of the plating base, but prior to the galvanic deposition of the copper, a modifying agent to the recess which serves to absorb in the surface regions not covered by the plating base and to thereby modify the surface regions not covered by the plating base to promote the galvanic deposition of the copper thereon;

wherein the modifying agent comprises a functional silane.

2. The method as claimed in claim 1, wherein the modifying agent absorbs into the surface regions not covered by the plating base so as to enhance the galvanic copper deposition kinetics for the modified surface.

3. The method as claimed in claim 1, wherein the modifying agent is arranged to absorb into the surface regions not covered by the plating base in a manner serving to counteract the effect of organic additives of a galvanic plating bath which would otherwise serve to decrease the plating rate of the surface regions not covered by the plating base.

4. The method as claimed in claim 1, wherein the silane contains a functionality of a cyanide-, amine-, or thiol-group.

5. A method of forming a copper structure, comprising:

providing a substrate having a recess formed therein;

forming a barrier layer on surfaces of the recess, the barrier layer having a surface;

forming a seed layer on the surface of the barrier layer, the seed layer having a surface, the seed layer at least partially covering the surface of the barrier layer;

applying a modifying agent to at least portions of the surface the barrier layer which are not covered by the seed layer; and forming a layer of copper by galvanic deposition over the seed layer surface and the modified barrier layer surface;

wherein the modifying agent comprises a molecule having at least one functional group, wherein the functional group is selected from the group consisting of a cyanide-group, an amine-group, and a thiol-group, and, wherein the molecule further includes three alkoxy groups.

6. The method of claim 5, wherein the molecule comprises silane having three alkoxy groups, and further having the functional group that is selected word the group consisting of a cyanide-group, an amine-group, and a thiol-group.

7. The method of claim 6, wherein the barrier layer comprises a material selected from the group consisting of tantalum and tantalum nitride.

8. The method claim 7, wherein the recess has an aspect ratio greater than or equal to four.

9. A method of forming a copper structure, comprising:

providing a substrate having a recess formed therein;

forming a barrier layer on surfaces of the recess, the barrier layer having a surface;

forming a seed layer on the surface of the barrier layer, the seed layer having a surface, the seed layer at least partially covering the surface of the barrier layer;

applying a modifying agent to at least portions of the surface of the barrier layer which are not covered by the seed layer; and forming a layer of copper by galvanic deposition over the seed layer surface and the modified barrier layer surface;

wherein the modifying agent comprises a molecule having at least one functional group, the molecule comprises silane and the functional group is selected from the group comprising of a cyanide-group, an amine-group, and a thiol-group.

10. The method of claim 9, wherein the barrier layer comprises a material selected from the group consisting of tantalum and tantalum nitride.

11. The method claim 9, wherein the recess has an aspect ratio greater than or equal to four.

* * * * *